(12) United States Patent
Yamamoto et al.

(10) Patent No.: US 7,540,912 B2
(45) Date of Patent: Jun. 2, 2009

(54) HARD FILMS AND SPUTTERING TARGETS FOR THE DEPOSITION THEREOF

(75) Inventors: Kenji Yamamoto, Kobe (JP); German Fox-Rabinovich, Hamilton (CA)

(73) Assignee: Kabushiki Kaisha Kobe Seiko Sho (Kobe Steel, Ltd.), Kobe-shi (JP)

( * ) Notice: Subject to any disclaimer, the term of this patent is extended or adjusted under 35 U.S.C. 154(b) by 108 days.

(21) Appl. No.: 11/428,491

(22) Filed: Jul. 3, 2006

(65) Prior Publication Data

US 2007/0099028 A1    May 3, 2007

(30) Foreign Application Priority Data

Nov. 2, 2005    (JP) .............................. 2005-319863

(51) Int. Cl.
*B32B 9/00* (2006.01)

(52) U.S. Cl. ................................. 106/287.17

(58) Field of Classification Search ............. 106/287.17
See application file for complete search history.

(56) References Cited

U.S. PATENT DOCUMENTS

| 5,981,078 | A  | * | 11/1999 | Tabersky et al. ............ 427/577 |
| 6,811,580 | B1 |   | 11/2004 | Littecke |
| 7,026,057 | B2 | * | 4/2006  | Sheek et al. ................ 428/610 |
| 7,144,547 | B2 | * | 12/2006 | Yamamoto et al. ............ 419/48 |
| 2001/0011634 | A1 | | 8/2001 | Chung-Lin et al. |

FOREIGN PATENT DOCUMENTS

| CN | 1552941    |   | 12/2004 |
| GB | 2 137 665  | * | 10/1984 |
| JP | 2644710    |   | 5/1997  |
| JP | 2004-42193 |   | 2/2004  |
| JP | 2004-74361 |   | 3/2004  |
| JP | 2004-100004|   | 4/2004  |

OTHER PUBLICATIONS

U.S. Appl. No. 11/466,671, filed Aug. 23, 2006, Yamamoto.
U.S. Appl. No. 11/536,201, filed Sep. 28, 2006, Yamamoto et al.
Erdem Atar, et al., "Wear Behavior of As-Deposited and Oxidized Ternary (Zr,Hf)N Coatings", Metallurgical and Materials transactions A, vol. 36A, XP-009072581, Oct. 2005, pp. 2793-2800.
Y.D. Blum, et al. "Chemical Reactivities of Hafnium and its Derived Boride, Carbide and Nitride Compounds at Relatively Mild Temperature", Journal of Materials Science, XP-002418019, vol. 39, 2004, pp. 6023-6042.
U.S. Appl. No. 11/774,990, filed Jul. 9, 2007, Yamamoto et al.

* cited by examiner

*Primary Examiner*—Archene Turner
(74) *Attorney, Agent, or Firm*—Oblon, Spivak, McClelland, Maier & Neustadt, P.C.

(57) ABSTRACT

For superior wear resistance to conventional TiN hard films and TiAlN hard films, a hard film contains $(Zr_{1-a}, Hf_a)(C_{1-x}N_x)$, wherein "a" and "x" are the atomic ratios of Hf and N, respectively, and satisfy the following conditions: $0.05 \leq a \leq 0.4$ and $0 \leq x \leq 1$. Another hard film contains $(Zr_{1-a-b}, Hf_a, M_b)(C_{1-x}N_x)$, wherein M is at least one of W and Me; and "a", "b", and "x" are the atomic ratios of Hf, M, and N, respectively, and satisfy the following conditions: $0 \leq 1-a-b$, $0 \leq a$, $0.03 \leq b \leq 0.35$, and $0 \leq x \leq 1$.

4 Claims, No Drawings

HARD FILMS AND SPUTTERING TARGETS FOR THE DEPOSITION THEREOF

BACKGROUND OF THE INVENTION

1. Field of the Invention

The present invention relates to hard films and sputtering targets for the deposition thereof. Specifically, it relates to hard films that have excellent lubricity at high temperatures, show excellent wear resistance and can improve the wear resistance and oxidation resistance of cutting tools such as tips, drills, and end mills, and plastic working jigs such as dies. It also relates to sputtering targets for use as evaporation sources in the deposition of the hard films.

2. Description of the Related Art

For improving wear resistance of cutting tools, hard films such as TiN, TiCN, or TiAlN are applied to base materials such as hardmetal (cemented carbide), cermet, or high-speed tool steel. In particular, multicomponent (carbo)nitride films of titanium and aluminum such as TiAlN films and TiAlCN films(hereinafter referred to as "TiAl hard films"), as disclosed in Japanese Patent No. 2644710, exhibit excellent wear resistance, and they are suitably applied to cutting tools for high-speed cutting operation or for cutting materials with high hardness such as hardened steels. However, further demands have been made to provide hard films with more excellent wear resistance with increasing hardness of materials to be cut or increasing speed of cutting operation.

Japanese Unexamined Patent Application Publication (JP-A) No. 2004-100004 discloses a film containing $(Ti_a, W_b)(C_x, N_y)_z$, wherein "a", "b", "x", and "y" are molar ratios and satisfy the following conditions: $0.6 \leq a \leq 0.94$, $0.06 \leq b \leq 0.4$, $a+b=1$, $0.1 \leq x \leq 0.9$, $0.1 \leq y \leq 0.9$, and $x+y=1$; and "z" is the total molar ratio of nonmetallic elements to metallic elements and satisfies the following condition: $0.8 \leq z \leq 1$. Disclosed examples of the film are (Ti, W)C, (Ti, W, Nb)C, (Ti, W, Ta)C, (Ti, W, Ta, Nb)C, (Ti, W, Al)C, (Ti, W, Si) C, (Ti, W) (C, N), (Ti, W, Nb) (C, N), (Ti, W, Ta) (C, N), (Ti, W, Ta, Nb) (C, N), (Ti, W, Al) (C, N), (Ti, W, Si) (C, N), (Ti, W)N, (Ti, W, Nb)N, (Ti, W, Ta)N, (Ti, W, Ta, Nb)N, (Ti, W, Al)N, and (Ti, W, Si)N. The document also discloses a film represented by $(Ti_a, W_b, M_c)(C_x, N_y)_z$, wherein M is at least one element selected from Al, Si, Zr, Hf, V, Nb, Ta, Cr, and Mo; "a", "b", "x", and "y" are molar ratios and satisfy the following conditions: $0.6 \leq a \leq 0.94$, $0.06 \leq b \leq 0.4$, $0 \leq c \leq 0.1$, $a+b+c=1$, $0.1 \leq x \leq 0.9$, $0.1 \leq y \leq 0.9$, $x+y=1$; and "z" is the total molar ratio of the nonmetallic elements C and N to the metallic elements Ti, W, and M and preferably satisfies $0.8 \leq z \leq 1$. It mentions that at least one element selected from Al, Si, Zr, Hf, V, Nb, Ta, Cr, and Mo maybe contained in the hard-metal base material or film. However, the W-containing film is used as an interlayer for improving the adhesion between TiN or TiCN and the hard-metal base material, and the document fails to describe the mechanical properties and lubricity of this layer.

SUMMARY OF THE INVENTION

Under these circumstances, an object of the present invention is to provide hard films having superior wear resistance to conventional TiN films and TiAlN films. Another object of the present invention is to provide sputtering targets for the deposition of the hard films.

After intensive investigations to achieve the objects, the present inventors have accomplished the present invention.

Thus, the present invention relates to hard films and sputtering targets for the deposition thereof and provides hard films in first, second, third, fourth, and fifth aspects, and sputtering targets for the deposition of these hard films in a sixth aspect.

Specifically, the present invention provides, in the first aspect, a hard film containing $(Zr_{1-a}, Hf_a)(C_{1-x}N_x)$ and satisfying following Conditions (1) and (2):

| | |
|---|---|
| $0.05 \leq a \leq 0.4$ | Condition (1) |
| $0 \leq x \leq 1$ | Condition (2) | wherein "a" and "x" are the atomic ratios of hafnium (Hf) and nitrogen (N), respectively.

In the second aspect, the present invention provides a hard film containing $(Zr_{1-a-b}, Hf_a, M_b)(C_{1-x}N_x)$ and satisfying following Conditions(1A) to (4A):

| | |
|---|---|
| $0 \leq 1 - a - b$ | Condition (1A) |
| $0 \leq a$ | Condition (2A) |
| $0.03 \leq b \leq 0.35$ | Condition (3A) |
| $0 \leq x \leq 1$ | Condition (4A) | wherein M is at least one of tungsten (W) and molybdenum (Mo); and "a", "b", and "x" are the atomic ratios of Hf, M, and N, respectively.

The present invention also provides, in the third aspect, a hard film containing $(Zr_{1-a-c}, Hf_a, D_c)(C_{1-x}N_x)$ and satisfying following Conditions (1B) to (3B):

| | |
|---|---|
| $0.05 \leq a \leq 0.4$ | Condition (1B) |
| $0.03 \leq c \leq 0.3$ | Condition (2B) |
| $0 \leq x \leq 1$ | Condition (3B) | wherein D is at least one of silicon (Si) and boron (B); and "a", "c", and "x" are the atomic ratios of Hf, D, and N, respectively.

The present invention further provides, in the fourth aspect, a hard film containing $(Zr_{1-a-b-c}, Hf_a, M_b, D_c)(C_{1-x}N_x)$ and satisfying following Conditions (1C) to (5C):

| | |
|---|---|
| $0 \leq 1 - a - b$ | Condition (1C) |
| $0 \leq a$ | Condition (2C) |
| $0.03 \leq b \leq 0.35$ | Condition (3C) |
| $0.03 \leq c \leq 0.3$ | Condition (4C) |
| $0 \leq x \leq 1$ | Condition (5C) | wherein M is at least one of tungsten (W) and molybdenum (Mo); D is at least one of silicon (Si) and boron (B); and "a", "b", "c", and "x" are the atomic ratios of Hf, M, D, and N.

The present invention provides, in the fifth aspect, a hard film containing a total of two or more layers of a first unit layer and a second unit layer arranged alternately, the first unit layer containing at least one of a hard film A1 and a hard film A2; and the second unit layer containing at least one selected from the group consisting of a hard film B1, a hard film B2, and a hard film B3, wherein the first unit layer has a thickness of 200 nm or less, and the second unit layer has a thickness of 200 nm or less, wherein the multilayer hard film as a whole has an average composition satisfying the composition of the hard film according to any one of the first, second, third, and fourth aspects, wherein the hard film A1 is a hard film containing $(Zr_{1-a}, Hf_a)(C_{1-x}N_x)$ and satisfying following Conditions (1D) to (3D)

| | |
|---|---|
| $0 \leq 1-a$ | Condition (1D) |
| $0 \leq a \leq 0.4$ | Condition (2D) |
| $0 \leq x \leq 1$ | Condition (3D) | wherein "a" and "x" are the atomic ratios of hafnium (Hf) and nitrogen (N), respectively, wherein the hard film A2 is a hard film containing $(Zr_{1-a-c}, Hf_a, D_c)(C_{1-x}N_x)$ and satisfying following Conditions (1B) to (3B)

| | |
|---|---|
| $0.05 \leq a \leq 0.4$ | Condition (1B) |
| $0.03 \leq c \leq 0.3$ | Condition (2B) |
| $0 \leq x \leq 1$ | Condition (3B) | wherein D is at least one of silicon (Si) and boron (B); and "a", "c", and "x" are the atomic ratios of Hf, D, and N, respectively, wherein the hard film $B_1$ is a hard film containing $M(C_{1-x}N_x)$ and satisfying following Condition (1E):

| | |
|---|---|
| $0 \leq x \leq 1$ | Condition (1E) | wherein M is at least one of tungsten (W) and molybdenum (Mo); and "x" is the atomic ratio of nitrogen (N), wherein the hard film B2 is a hard film containing $Si_{1-y-x}C_yN_x$ and satisfying following Conditions (1F) to (3F):

| | |
|---|---|
| $0 \leq y \leq 0.25$ | Condition (1F) |
| $0 < x \leq 1$ | Condition (2F) |
| $0.5 \leq (1-y-x)/x \leq 1.4$ | Condition (3F) | wherein "y" and "x" are the atomic ratios of carbon (C) and nitrogen (N), respectively, and wherein the hard film B3 is a hard film containing $B_{1-y-x}C_yN_x$ and satisfying following Conditions (1G) to (3G):

| | |
|---|---|
| $0 \leq y \leq 0.25$ | Condition (1G) |
| $0 < x \leq 1$ | Condition (2G) |
| $0.5 \leq (1-y-x)/x \leq 1.5$ | Condition (3G) | wherein "y" and "x" are the atomic ratios of carbon (C) and nitrogen (N), respectively.

In addition and advantageously, the present invention provides, in the sixth aspect, a sputtering target for the deposition of hard films, having the same composition of metallic elements as with any one of the hard films according to the present invention and having a relative density of 91% or more.

The present invention can provide hard films having superior wear resistance to conventional TiN hard films and TiAlN hard films. Specifically, the hard films according to the first to fifth aspects of the present invention have superior wear resistance to conventional TiN hard films and TiAlN hard films, and they can be suitably used as hard films for cutting tools and plastic working jigs to thereby improve the durability of these tools. The sputtering targets according to the present invention can deposit these hard films according to the present invention.

DESCRIPTION OF THE PREFERRED EMBODIMENTS

After intensive investigations to achieve the above-mentioned objects, the present inventors have found that films having higher hardness and more excellent wear resistance can be obtained by employing (Zr, Hf)N multi-component films instead of conventional TiN hard films and ZrN hard films. The films are more stabilized by containing Hf, because HfN show a greater negative free energy than TiN and ZrN upon deposition. If the Hf content in terms of atomic ratio is less than 0.05, the effects of Hf addition are not sufficiently obtained. In contrast, if it exceeds 0.4, the effects become saturated. Carbon (C) acts to form highly hard carbides such as HfC and ZrC to thereby further increase the hardness and lubricity of the films. However, excessive carbon may reduce the oxidation resistance of the films, and the carbon content is preferably adjusted according to the temperature and purpose of use.

The present inventors have also found that, by incorporating appropriate amounts of W and/or Mo into Hf—Zr-containing films, the resulting films can have sufficient lubricity at high temperatures and can exhibit excellent wear resistance when used in applications requiring wear resistance at high temperatures due to, for example, heat from cutting tools. For example, W and Mo generate heat to thereby form oxides when a cutting tool and a chipping or workpiece undergo sliding at high speed upon cutting. The oxides of W and Me include $WO_2$ (melting point: 1500° C.), $WO_3$ (melting point: 1470° C.), $MoO_2$ (melting point: 1100° C.), and $MoO_3$ (melting point: 795° C. to 801° C.). These oxides formed at sliding faces have melting points near to the "sliding face temperature" upon cutting, and they are flexible and exhibit lubricity at these temperatures. To exhibit such lubricity, the total content of at least one of W and Mo in terms of atomic ratio should be 0.03 or more. If the total content of at least one of W and Mo exceeds 0.35, oxidation markedly proceeds to thereby cause oxidative wear. The total content of W and/or Mo is preferably 0.05 or more and 0.3 or less, and more preferably 0.07 or more and 0.2 or less. These effects of W and Mo, such as higher hardness and more excellent lubricity at high temperatures, can be exhibited even when the films contain only one of Zr and Hf, such as in ZrWN films or HfMoN films.

The present invention has been achieved based on these findings. Specifically, of the hard films according to the present invention, one according to the first embodiment is a hard film comprising $(Zr_{1-a}, Hf_a)(C_{1-x}N_x)$ and satisfying above-mentioned Conditions (1) and (2). The hard film according to the second embodiment of the present invention is a hard film comprising $(Zr_{1-a-b}, Hf_a, M_b)(C_{1-x}N_x)$ and satisfying Conditions (1A) to (4A), wherein M is at least one of tungsten (W) and molybdenum (Mo). The hard films according to the first and second embodiments of the present invention have superior wear resistance to conventional TiN hard films and TiAlN hard films and can advantageously used as hard films for cutting tools and plastic working jigs to thereby improve their durability. Of these hard films, those according to the second embodiment of the present invention exhibit further excellent lubricity at high temperatures and show excellent wear resistance even when used in applications requiring the wear resistance at high temperatures due typically to heat from cutting tools. Accordingly, they can also be used in these applications and improve the durability of the tools.

The hard films according to the second embodiment can also be expressed as hard films comprising [$Zr_{1-a-b}$, $Hf_a$, (W, Mo)b] ($C_{1-x}N_x$) and satisfying following Conditions (1A) to (4A):

| | |
|---|---|
| $0 \leq 1 - a - b$ | Condition (1A) |
| $0 \leq a$ | Condition (2A) |
| $b_W + b_{Mo} = b$ | Condition (3A-1) |
| $0.03 \leq b \leq 0.35$ | Condition (3A-2) |
| $0 \leq x \leq 1$ | Condition (4A) | wherein "a", "$b_W$", "$b_{Mo}$", and "x" are the atomic ratios of Hf, W, Mo, and N, respectively.

The hard films according to the first embodiment must satisfy Condition (1): $0.05 \leq a \leq 0.4$, wherein "a" is the atomic ratio of Hf. If the atomic ratio "a" is less than 0.05, the effect of Hf to improve the wear resistance is insufficient. This effect increases with an increasing atomic ratio "a" at "a" of 0.05 or more, but it becomes saturated at "a" exceeding 0.4. The atomic ratio "a" is preferably 0.1 or more and more preferably 0.15 or more.

Carbon (C) forms highly hard carbides such as HfC and ZrC and contributes to higher hardness and improved lubricity of the films, as is described above. However, excessive carbon may reduce the oxidation resistance of the films, and the carbon content can be adjusted according to the temperature and purpose of use.

The hard films according to the second embodiment must satisfy Condition (3A): $0.03 \leq b \leq 0.35$, wherein "b" is the atomic ratio of M, wherein M is at least one of W and Mo. If the atomic ratio "b" is less than 0.03, the effect of M, namely, at least one of W and Mo to improve the lubricity at high temperatures is insufficient. This effect increases with an increasing atomic ratio "b" at "b" of 0.03 or more, but the oxidation may significantly proceed to thereby cause oxidative wear if the atomic ratio "b" exceeds 0.35. The atomic ratio "b" is preferably 0.05 to 0.3 and more preferably 0.07 to 0.2.

The reasons for specifying Condition (2A): $0<a$, and Condition (1A): $0 \leq 1-a-b$, wherein "a" and "b" are atomic ratios of Hf and M, respectively, and wherein M is at least one of W and Mo, will be explained below. By incorporating M, i.e., at least one of W and Mo, the hardness can be increased and the lubricity at high temperatures can be improved, and excellent wear resistance can therefore be ensured even when the films contain not both but one of Zr and Hf, as in ZrWN and HfMoN. Consequently, the atomic ratio "a" can be 0, and the atomic ratio of Zr (1-a-b) can be 0. Thus, Condition (2A): $0<a$, and Condition (1A): $0 \leq 1-a-b$ are specified. The atomic ratio "a" is preferably 0.5 or less and more preferably 0.4 or less, because the effect of Hf to improve the wear resistance becomes saturated when "a" exceeds 0.5.

Carbon (C) forms highly hard carbides such as HfC and ZrC and contributes to higher hardness and improved lubricity of the films, as in the hard films according to the first embodiment. However, excessive carbon may reduce the oxidation resistance of the films, and the carbon content can be adjusted according to the temperature and purpose of use.

By further comprising silicon (Si) and/or boron (B) (at least one of Si and B), the hard films according to the first and second embodiments can have further fine crystal grains to thereby have higher hardness. These effects may be insufficient unless the total content of at least one of Si and B in terms of atomic ratio is 0.03 or more. In contrast, the films may become amorphous to have decreased hardness if the total content exceeds 0.3. At least one of Si and B is therefore preferably incorporated at an atomic ratio of 0.03 to 0.3 in order to yield finer crystal grains and higher hardness of the films.

Consequently, the hard films according to the third embodiment of the present invention are hard films according to the first embodiment further comprising 0.03 to 0.3 in terms of atomic ratio of at least one of Si and B. The hard films according to the fourth embodiment of the present invention are hard films according to the second embodiment further comprising 0.03 to 0.3 in terms of atomic ratio of at least one of Si and B.

Specifically, the hard films according to the third embodiment are hard films comprising ($Zr_{1-a-c}$, $Hf_a$, $D_c$) ($C_{1-x}N_x$), wherein D is at least one of Si and B, and satisfying above-mentioned Conditions (1B) to (3B). The hard films according to the fourth embodiment are hard films comprising ($Zr_{1-a-b-c}$, $Hf_a$, $M_b$, $D_c$) ($C_{1-x}N_x$), wherein M is at least one of tungsten (W) and molybdenum (Me); and D is at least one of Si and B, and satisfying Conditions (1C) to (5C).

The hard films according to the third embodiment comprise finer crystal grains and show higher hardness and more excellent wear resistance than the hard films according to the first embodiment. The hard films according to the fourth embodiment comprise finer crystal grains and show higher hardness and more excellent wear resistance than the hard films according to the second embodiment.

The reasons why the hard films according to the third embodiment must satisfy Condition (1B) are as with Condition (1) in the hard films according to the first embodiment. The reasons why they must satisfy Condition (2B) $0.03 \leq c < 0.3$, wherein "c" is the atomic ratio of D; and D is at least one of Si and B, are as follows. If the atomic ratio "c" is less than 0.03, the addition of D, i.e., at least one of Si and B, may not sufficiently yield finer crystal grains and increase the hardness of the films. These effects increase with an increasing atomic ratio "c" when "c" is 0.03 or more. However, the films may become amorphous to thereby have reduced hardness if the atomic ratio "c" exceeds 0.3. The atomic ratio "c" is preferably 0.07 or less, so as to more reliably prevent the films from becoming amorphous and from decreasing in hardness. Namely, the atomic ratio "c" is preferably 0.03 to 0.07.

The reasons why the hard films according to the fourth embodiment must satisfy Conditions (1C), (2C), and (3C) are as with Conditions (1A), (2A), and (3A) in the hard films according to the second embodiment. The reasons why they must satisfy Condition (4C): $0.03 \leq c \leq 0.3$, wherein "c" is the atomic ratio of D, and wherein D is at least one of Si and B, are as with Condition (2B) in the hard films according to the third embodiment. The atomic ratio "c" is preferably 0.03 to 0.07, as in the third embodiment.

The hard films according to the first to fourth embodiments can each be a single-layer film comprising uniformly distributed elements, a film comprising elements with a gradient or uneven distribution, or a multilayer film, as long as they have compositions as the hard films according to the first to fourth embodiments. When they are multilayer films, taking a (Zr, Hf, W, Si)N film as an example, they can be multilayer films comprising a (Zr, Hf)N layer and a (W, Si)N layer, or those comprising a (Zr, Hf, W)N and a SiN layer. The present inventors have found that multilayer films comprising a first unit layer of a (Zr, Hf)(CN) film; and a second unit layer of a M(CN), SiCN or BCN film can yield equivalent or superior properties to those of the hard films according to the first to fourth embodiments. The period of unit layers of these multilayer films, i.e., the thickness of each unit layer is preferably 200 nm or less, because if it exceeds 200 nm, the individual properties of unit layers become predominant, and the effects of lamination (conversion into multilayer films) may be insufficient to thereby fail to provide satisfactorily desired properties of multilayer films.

Consequently, the hard films according to the fifth embodiment are multilayer hard films each comprising a first unit layer of at least one of a (Zr, Hf) (CN) film and a (Zr, Hf, D) (CN) film, wherein D is at least one of silicon (Si) and boron (B); and a second unit layer of at least one of a M(CN) film, a SiCN film, and a BCN film.

Specifically, the hard films according to the fifth embodiment are hard films comprising a total of two or more layers of a first unit layer and a second unit layer arranged alternately, the first unit layer comprising at least one of a hard film A1 and a hard film A2; and the second unit layer comprising at least one selected from the group consisting of a hard film B1, a hard film B2, and a hard film B3, in which the first unit layer has a thickness of 200 nm or less, and the second unit layer has a thickness of 200 nm or less, and the multilayer hard film as a whole has an average composition satisfying the composition of the hard film according to any one of the first to fourth embodiments, wherein the hard film A1 is a hard film comprising $(Zr_{1-a}, Hf_a)(C_{1-x}N_x)$ and satisfying following Conditions (1D) to (3D)

| | |
|---|---|
| $0 \leq 1 - a$ | Condition (1D) |
| $0 \leq a \leq 0.4$ | Condition (2D) |
| $0 \leq x \leq 1$ | Condition (3D) | wherein "a" and "x" are the atomic ratios of hafnium (Hf) and nitrogen (N), respectively, the hard film A2 is a hard film comprising $(Zr_{1-a-c}, Hf_a, D_c)(C_{1-x}N_x)$ and satisfying following Conditions (1B) to (3B)

| | |
|---|---|
| $0.05 \leq a \leq 0.4$ | Condition (1B) |
| $0.03 \leq c \leq 0.3$ | Condition (2B) |
| $0 \leq x \leq 1$ | Condition (3B) | wherein D is at least one of silicon (Si) and boron (B); and "a", "c", and "x" are the atomic ratios of Hf, D, and N, respectively, the hard film B1 is a hard film comprising $M(C_{1-x}N_x)$ and satisfying following Condition (1E):

| | |
|---|---|
| $0 \leq x \leq 1$ | Condition (1E) | wherein M is at least one of tungsten (W) and molybdenum (Mo); and "x" is the atomic ratio of nitrogen (N), the hard film B2 is a hard film comprising $Si_{1-y-x} C_y N_x$ and satisfying following Conditions (1F) to (3F):

| | |
|---|---|
| $0 \leq y \leq 0.25$ | Condition (1F) |
| $0 < x \leq 1$ | Condition (2F) |
| $0.5 \leq (1 - y - x)/x \leq 1.4$ | Condition (3F) | wherein "y" and "x" are the atomic ratios of carbon (C) and nitrogen (N), respectively, and the hard film B3 is a hard film comprising $B_{1-y-x}C_yN_x$ and satisfying following Conditions (1G) to (3G):

| | |
|---|---|
| $0 \leq y \leq 0.25$ | Condition (1G) |
| $0 < x \leq 1$ | Condition (2G) |
| $0.5 \leq (1-y-x)/x < 1.5$ | Condition (3G) | wherein "y" and "x" are the atomic ratios of carbon (C) and nitrogen (N), respectively.

In the multilayer hard films according to the fifth embodiment, the thickness of the first unit layer comprising at least one of the hard film A1 and the hard film A2 (hereinafter also referred to as "hard film A"), and the thickness of the second unit layer comprising at least one of the hard film B1, the hard film B2, and the hard film B3 (hereinafter also referred to as "hard film B") must be 200 nm or less. This is because, if the thickness of the hard film A and/or the hard film B exceeds 200 nm, the properties of a layer having a thickness exceeding 200 nm become predominant, and the effects of lamination are insufficient to thereby fail to provide desired performance. From this viewpoint, the thickness of each of these unit layers, i.e., the hard film A and the hard film B, is preferably 100 nm or less, more preferably 50 nm or less, and further preferably 20 nm or less.

The "multilayer hard film comprising a total of two or more layers of a first unit layer (hard film A) and a second unit layer (hard film B) arranged alternately" in the hard films according to the fifth embodiment means and includes multilayer hard films comprising a total of two or more layers of the hard film A and one of the hard film B1, the hard film B2, and the hard film B3 arranged alternately (hereinafter also referred to as multilayer films "I"); multilayer hard films comprising a total of two or more layers of the hard film A and two of the hard film B1, the hard film B2, and the hard film B3 arranged alternately (hereinafter also referred to as multilayer films "II"); and multilayer hard films comprising a total of two or more layers of the hard film A and three of the hard film B1, the hard film B2, and the hard film B3 arranged alternately (hereinafter also referred to as multilayer films "III"). Examples of the multilayer films "I" are a hard film comprising a total of two or more layers of the hard film A and the hard film B1 arranged alternately; and a hard film comprising a total of two or more layers of the hard film A and the hard film B3 arranged alternately. Examples of the multilayer films "II" are a hard film comprising the hard film A, the hard film B1, the hard film A, and the hard film B2 arranged in this order; a hard film comprising the hard film A, the hard film B1, the hard film A, and the hard film B3 arranged in this order; and a hard film comprising the hard film B1, the hard film A, and the hard film B3 arranged in this order. Examples of the multilayer films "II" also include a hard film comprising the hard film A, the hard film B1 and the hard film B2 arranged thereon (the layer comprising the hard film B1 and the hard film B2 is hereinafter also referred to as "hard film layer B1+B2"), the hard film A, and the hard film B2 (this layer is hereinafter also referred to as "single-layer B2") arranged in this order. In this case, the thickness of the single-layer B2 corresponds to the thickness of the second unit layer comprising at least one of the hard film B1, the hard film B2, and the hard film B3 and must be 200 nm or less. The thickness of the hard film layer B1+B2 corresponds to the thickness of the second unit layer comprising at least one of the hard film B1, the hard film B2, and the hard film B3 and must be 200 nm or less. Examples of the multilayer films "III" include a hard film comprising the hard film A, the hard film B1, the hard film A, the hard film B2, the hard film A, and the hard film B3 arranged in this order. Examples of the multilayer films "III" also include a multilayer hard film comprising the hard film A, the hard film B1 arranged thereon (hereinafter also referred to as "single-layer B1"), the hard film B2 (single-layer B2) (the layer comprising the hard film B1 and the hard film B2 is also referred to as "hard film layer B1+B2"), the hard film A, and the hard film B3 (hereinafter also referred to as "single-layer B3") arranged in this order; and a multilayer hard film comprising the hard film A, the hard film B1 (single-layer B1) and the hard film B2 (single-layer B2) arranged in this order on the hard film A (the layer comprising the hard film B1 and the hard film B2 is also referred to as "hard film layer B1+B2"), the hard film A, the hard film B2 (single-layer B2), and the hard film B3 (single-layer B3) arranged in this order. The thickness of the single-layer Bl, the thickness of the single-layer B2, and the thickness of the single-layer B3 each correspond to the thickness of the second unit layer comprising at least one of the hard film B1, the hard film B2, and the hard film B3 and must be 200 nm or less. The thickness of the hard film layer B1+B2 corresponds to the thickness of the second unit layer comprising at least one of the hard film B1, the hard film B2, and the hard film B3 and must be 200 nm or less.

The hard films according to the present invention (the first to fifth embodiments) are deposited effectively by a "vapor-phase" coating process. Of such vapor-phase coating processes, electron beam vapor deposition and hollow cathode ion plating, in which a material evaporation source is melted and vaporized, are not suitable for the deposition of the hard films. This is because respective elements evaporate in different amounts due to their different melting points according to these techniques, and the control of the compositions of the resulting hard films is very difficult. The hard films according to the present invention are preferably deposited by sputtering or cathode arc ion plating (hereinafter also referred to as "AIP"), in which a solid evaporation source is used, and the resulting hard films have compositions near to that of the evaporation source. Of such sputtering processes, unbalanced magnetron sputtering (hereinafter also referred to as "UBMS") and high-power pulse sputtering, in which a large quantity of ions are applied to base materials to be deposited, are preferred. Of these deposition techniques using solid evaporation sources, sputtering and AIP show a significant dependency of discharge suitability on the quality of a sputtering target, because a high voltage of several hundreds of volts and a large amount of electric current of about 100 amperes are applied to the sputtering target in sputtering and in AIP, respectively. Specifically, the sputtering target to be used must have a high relative density and be dense, because, if it has a low relative density and includes, for example, defects such as vacancy, the defects cause abnormal discharge. Sputtering targets having a relative density of 91% or more do not cause abnormal discharge and can stably undergo discharge.

Accordingly, the sputtering targets for the deposition of hard films according to the present invention have the same composition of metallic elements as that of the hard film according to any one of the first to fourth embodiments and have a relative density of 91% or more. These sputtering targets can stably undergo discharge without causing abnormal discharge and can deposit the hard films according to the first to fourth embodiments. They can deposit the hard films according to the fifth embodiment when used in combination with sputtering targets comprising, for example, W, Me, Si, and/or B.

The relative density of the sputtering targets is more preferably 95% or more so as to deposit the hard films according to the present invention more reliably with more stable discharge. The relative density of a sputtering target is the percentage of the actual density (D2) determined from the weight and volume of the target to the ideal density (D1) which is in turn determined based on the compositional phase (pure metal or alloy) of the target [100×D2/D1 (%)].

EXAMPLES

The present invention will be illustrated in further detail with reference to several examples and comparative examples below. It is to be noted that the followings are only examples which by no means limit the scope of the present invention, and various changes and modifications are possible therein without departing from the teaching and scope of the present invention.

Experimental Example 1

A series of (Zr, Hf) (CN) films having different compositions were deposited using sputtering targets comprising Zr and/or Hf and a film-deposition system having an AIP evaporation source and an UBMS evaporation source.

As base materials, a hard-metal substrate was used for the deposition of films for determination of the crystal structure, composition, and hardness of films and for determination of friction coefficient at high temperatures; and a hard-metal ball end mill (two-flute) having a diameter of 10 mm was used for the deposition of films for cutting tests. These films were deposited in the following manner. The base material was placed in a chamber of the film-deposition system, the chamber was evacuated, the substrate was heated to about 500° C., and ion cleaning was carried out using Ar ion at an Ar pressure of 0.6 Pa and a substrate bias voltage of −500 V for three minutes.

After the ion cleaning, the film deposition according to UBMS was carried out in a gaseous mixture of argon-nitrogen or argon-nitrogen-methane at a total pressure of 0.6 Pa and a voltage applied to the substrate of 70 V; and the film deposition according to AIP was carried out in nitrogen atmosphere or a gaseous mixture of nitrogen-methane at a total pressure of 4 Pa, an applied bias of 70 V and an arc current of 150 A. The films were deposited to a thickness of about 3 μm.

On these films, the crystal structure, composition, and hardness were determined, the friction coefficient at high temperatures was measured, and the cutting test was conducted.

The crystal structure of a sample film was determined by X-ray diffraction analysis. The composition of metallic elements in the film was determined by EPMA analysis. The hardness of the film was measured under a load of 25 gf for a measurement time of 15 seconds using a micro-Vickers hardness meter. The friction coefficient of the film was measured in the following manner.

The test sample was slid with a hot-die steel (JIS-SKD61, HRC50) as a counter member at a temperature of 800° C. in an atmosphere of the air at a sliding speed of 0.3 meter per second under a normal load of 2 N, and the friction coefficient was measured after sliding 1000 meters.

The cutting test was carried out using a test piece comprising the hard-metal ball end mill (two-flute) having a diameter of 10 mm and a deposited film thereon to a cutting length of 50 meters under the following conditions. The wear amount of the flank at interface of the test piece after the cutting test was measured, and the cutting performance was evaluated based on the wear amount. The wear amount herein is defined as the width of flank wear of the tested cutting tool (hereinafter the same).

Cutting test conditions:
Work piece: stainless steel SUS 304
Cutting speed: 220 m/minute
Feed per tooth: 0.3 mm/tooth
Axial cutting depth: 1 mm
Radial cutting depth: 1 mm
Cutting length: 50 m The results are shown in Table 1. The symbol "B1" in the crystal structure of Table 1 indicates that the film is crystalline.

Table 1 demonstrates as follows. The film No. 1 ($Ti_{0.5}Al_{0.5}N$ film) has a friction coefficient at high temperatures of 0.8 and a wear amount in the cutting test of 65 μm (Comparative Example). The film No. 2 (TiN film) has a lower friction coefficient at high temperatures but a greater wear amount in the cutting test (Comparative Example) than the film No. 1. The film No. 3 (CrN film) has a further lower friction coefficient at high temperatures and thereby shows excellent lubricity at high temperatures, but it has a lower hardness and a greater wear amount in the cutting test and shows poor wear resistance (Comparative Example).

The films No. 4 (ZrN film), No. 5 [$Hf(C_{0.5}NO_{0.5})$ film], and No. 6 [$(Zr_{0.98}Hf_{0.02})N$ film] (Comparative Examples) have properties located between those of the film No. 2 and the film No. 3. Specifically, they have a lower friction coefficient at high temperatures but a greater wear amount in the cutting test than the film No. 2. They have a smaller wear amount in the cutting test but a higher friction coefficient at high temperatures than the film No. 3.

In contrast, the films Nos. 7 to 11 [$(Zr_{1-a}, Hf_a)$ N films] satisfy the requirements according to the first embodiment of the present invention and are examples of the hard films according to the first embodiment. They have a low friction coefficient at high temperatures as low as that of the film No. 3 and show excellent lubricity at high temperatures. They have a significantly smaller wear amount in the cutting test than the films Nos. 1 to 6 and show very excellent wear resistance. All factors considered, they are superior to the films Nos. 1 to 6.

The films Nos. 12 and 13 [$(Zr_{1-a}, Hf_a)$ N films] have an atomic ratio "a" exceeding 0.4 and do not satisfy the requirement according to the first embodiment of the present invention (Comparative Examples). They have a higher friction coefficient at high temperatures and a significantly greater wear amount in the cutting test, and show significantly poorer wear resistance than the films Nos. 7 to 11.

The films Nos. 14 to 17 [$(Zr_{1-a}, Hf_a)(C_{1-x}N_x)$ films] and the film No. 18 [$(Zr_{1-a}, Hf_a)$ C film] satisfy the requirements according to the first embodiment of the present invention and are examples of the hard films according to the first embodiment. They have a lower friction coefficient at high temperatures and thereby more excellent lubricity at high temperatures than the films Nos. 7 to 11. They also have a significantly small wear amount in the cutting test and show very excellent wear resistance, as with the films Nos. 7 to 11. All factors considered, they are superior to the films Nos. 1 to 6 and even to the films Nos. 7 to 11.

Experimental Example 2

A series of (Zr, Hf, M) (CN) films having different compositions were deposited using sputtering targets comprising Zr, Hf, and M, wherein M is at least one of tungsten (W) and molybdenum (Mo), and a film-deposition system having an AIP evaporation source and an UBMS evaporation source.

As base materials, a hard-metal substrate was used for the deposition of films for determination of the crystal structure, composition, and hardness of films and for determination of friction coefficient at high temperatures; and a hard-metal ball end mill (two-flute) having a diameter of 10 mm was used for the deposition of films for cutting tests. These films were deposited in the following manner. The base material was placed in a chamber of the film-deposition system, the chamber was evacuated, the substrate was heated to about 500° C., and ion cleaning was carried out using Ar ion at an Ar pressure of 0.6 Pa and a substrate bias voltage of −500 V for three minutes.

After the ion cleaning, the film deposition according to UBMS was carried out in a gaseous mixture of argon-nitrogen or argon-nitrogen-methane at a total pressure of 0.6 Pa and a voltage applied to the substrate of 70 V; and the film deposition according to AIP was carried out in nitrogen atmosphere or a gaseous mixture of nitrogen-methane at a total pressure of 4 Pa, an applied bias of 70 V, and an arc current of 150 A. The films were deposited to a thickness of about 3 μm.

On these films, the crystal structure, composition, and hardness were determined, the friction coefficient at high temperatures was measured, and the cutting test was conducted by the procedures of Experimental Example 1.

The results are shown in Table 2. The symbol "B1" in the crystal structure of Table 2 indicates that the film is crystalline.

Table 2 demonstrates as follows. The film No. 4A [$(Zr_{0.85}, Hf_{0.15})N$ film] satisfies the requirements according to the first embodiment of the present invention and corresponds to the film No. 9 (the example according to the first embodiment of the present invention) in Table 1. The films Nos. 5A and 6A [$(Zr_{1-a-b}, Hf_a, M_b)N$ films] have an atomic ratio "b" less than 0.03, and the film No. 12A [$(Zr_{1-a-b}, Hf_a, M_b)N$ film] has an atomic ratio "b" exceeding 0.35. Accordingly, they do not satisfy one of the requirements according to the second embodiment of the present invention. They show equivalent performance in friction coefficient at high temperatures and wear amount in the cutting test to the film No. 4A.

In contrast, the films Nos. 7A to 11A [$(Zr_{1-a-b}, Hf_a, M_b)N$ films], the films Nos. 13A and 14A [$(Zr_{1-a-b}, Hf_a, M_b)N$ films], and the films Nos. 15A and 16A [$(Zr_{1-a-b}, Hf_a, M_b)(C_{1-x}N_x)$ films] satisfy the requirements according to the second embodiment of the present invention, have a low friction coefficient at high temperatures, show excellent lubricity at high temperatures, have a small wear amount in the cutting test, and show excellent wear resistance. They are examples of the second embodiment of the present invention.

Experimental Example 3

A series of (Zr, Hf, M, D)(CN) films having different compositions were deposited using sputtering targets comprising Zr, Hf, M, and D, wherein M is at least one of tungsten (W) and molybdenum (Mo); and D is at least one of silicon (Si) and boron (B), and a film-deposition system having an AIP evaporation source and an UBMS evaporation source.

As base materials, a hard-metal substrate was used for the deposition of films for determination of the crystal structure, composition, and hardness of films and for determination of friction coefficient at high temperatures; and a hard-metal ball end mill (two-flute) having a diameter of 10 mm was used for the deposition of films for cutting tests. These films were deposited in the following manner. The base material was placed in a chamber of the film-deposition system, the chamber was evacuated, the substrate was heated to about 500° C., and ion cleaning was carried out using Ar ion at an Ar pressure of 0.6 Pa and a substrate bias voltage of −500 V for three minutes.

After the ion cleaning, the film deposition according to UBMS was carried out in a gaseous mixture of argon-nitrogen or argon-nitrogen-methane at a total pressure of 0.6 Pa and a voltage applied to the substrate of 70 V; and the film deposition according to AIP was carried out in nitrogen atmosphere or a gaseous mixture of nitrogen-methane at a total pressure of 4 Pa, an applied bias of 70 V and an arc current of 150 A. The films were deposited to a thickness of about 3 μm.

On these films, the crystal structure, composition, and hardness were determined, the friction coefficient at high temperatures was measured, and the cutting test was conducted by the procedures of Experimental Example 1.

The results are shown in Table 3. The symbols "B1", "B4", and "B1+B4" in the crystal structure in Table 3 indicate that the film is crystalline, that the film is amorphous, and that the film comprises a mixture of crystalline and amorphous portions, respectively.

Table 3 demonstrates as follows. The film No. 4B [$(Zr_{1-a-b-c}, Hf_a, M_b, D_c)(C_{1-x}N_x)$ film] has an atomic ratio "c" less than 0.03; the film No. 9B [$(Zr_{1-a-b-c}, Hf_a, M_b, D_c)(C_{1-x}N_x)$ film] has an atomic ratio "c" exceeding 0.3; the film No. 10B [$(Zr_{1-a-b-c}, Hf_a, M_b, D_c)(C_{1-x}N_x)$ film] has an atomic ratio "c" less than 0.03; and the film No. 14B [$(Zr_{1-a-b-c}, Hf_a, M_b, D_c)(C_{1-x}N_x)$ film] has an atomic ratio "c" exceeding 0.3. These films do not satisfy the requirement according to the fourth embodiment of the present invention. As compared with these films, the films Nos. 5B to 8B [$(Zr_{1-a-b-c}, Hf_a, M_b, D_c)(C_{1-x}N_x)$ films] and the films Nos. 11B to 13B [$(Zr_{1-a-b-c}, Hf_a, M_b, D_c)(C_{1-x}N_x)$ films] satisfy all the requirements according to the fourth embodiment of the present invention and have a smaller wear amount in the cutting test and show more excellent wear resistance. Specifically, they are examples of the fourth embodiment of the present invention.

Experimental Example 4

A series of multilayer films comprising a hard film A [$(Zr_{1-a}, Hf_a)(C_{1-x}N_x)$ film] and one of a hard film B1 [$M(C_{1-x}N_x)$ film, wherein M is at least one of tungsten (W) and molybdenum (Mo)], a hard film B2 [$Si_{1-y-x}C_yN_x$ film], and a hard film B3 [$B_{1-y-x}C_yN_x$ film] arranged alternately were deposited using a film-deposition system including an AIP evaporation source and a UBMS evaporation source.

As base materials, a hard-metal substrate was used for the deposition of films for determination of the crystal structure, composition, and hardness of films and for determination of friction coefficient at high temperatures; and a hard-metal ball end mill (two-flute) having a diameter of 10 mm was used for the deposition of films for cutting tests. These films were deposited in the following manner. The base material was placed in a chamber of the film-deposition system, the chamber was evacuated, the substrate was heated to about 500° C., and ion cleaning was carried out using Ar ion at an Ar pressure of 0.6 Pa and a substrate bias voltage of −500 V for three minutes.

After the ion cleaning, the AIP evaporation source and the UBMS evaporation source were discharged simultaneously, the substrate was rotated on the substrate stage at the center to allow the substrate to pass through the front of the AIP evaporation source and the UBMS evaporation source alternately to deposit a hard film A and a hard film B1, B2 or B3 alternately to thereby form a multilayer film. In this case, the hard film A was derived from the AIP evaporation source, and the hard film B1, B2 or B3 was derived from the UBMS evaporation source. To deposit the film, a 50:50 (by volume) gaseous mixture of Ar and nitrogen was introduced, and the AIP evaporation source and the UBMS evaporation source were discharged simultaneously. A voltage at 70 V was applied to the substrate upon film deposition. The thickness of the unit hard film A (thickness per single layer), and the thickness of the unit hard film B (hard film B1, B2 or B3) (thickness per single layer) are shown in Table 4. The resulting multilayer films each have a total thickness of about 3 μm.

On these films, the crystal structure, composition, and hardness were determined, the friction coefficient at high temperatures was measured, and the cutting test was conducted by the procedures of Experimental Example 1.

The results are shown in Table 4. The symbol "B1" in the crystal structure of Table 4 indicates that the film is crystalline. The "hard film B" refers to the hard film B1, B2 or B3.

The films Nos. 4C to 10C in Table 4 are multilayer films comprising the hard film A and the hard film B1, B2, or B3 arranged alternately. Of these films, the films Nos. 4C to 7C are multilayer films comprising a hard film A [$(Zr_{0.8}Hf_{0.2})N$ film] and a hard film B1 [W $(C_{0.1}N_{0.8})$ film] arranged alternately, in which the thickness of the hard film A and that of the hard film B1 differ from multilayer film to multilayer film. The films Nos. 8C and 9C are multilayer films comprising a hard film A [$(Zr_{0.8}, Hf_{0.2})(C_{0.2}N0.8)$ film] and a hard film B3 [$B_{0.45}C_{0.1}N_{0.45}$ film] arranged alternately, in which the thickness of the hard film A and that of the hard film B3 differ from multilayer film to multilayer film. The film No. 10C is a multilayer film comprising a hard film A [$(Zr_{0.8}, Hf_{0.2})(C_{0.2}N_{08})$ film] and a hard film B2 [$Si_{0.4}N_{0.6}$ film] arranged alternately. These films satisfy the requirements according to the fifth embodiment of the present invention.

Table 4 demonstrates as follows. The films Nos. 4C to 10C have a low friction coefficient at high temperatures and excellent lubricity at high temperatures and show a small wear amount in the cutting test and excellent wear resistance. They are examples according to the fifth embodiment of the present invention.

Experimental Example 5

Sputtering targets having a composition of $Zr_{0.64}Hf_{0.15}W_{0.15}Si_{0.06}$ (atomic ratio) were prepared by HIP, hot forging, and sintering, respectively, and their relative densities were determined. The relative densities were determined by analyzing constitutional phases of the target by X-ray diffraction analysis, determining the theoretical density (D1) based on the phase configuration, determining the density (D2) of the actual target by the Archimedes method, and determining the relative density (D3) by calculation according to the following equation: D3 (%)=100×D2/D$_1$. The hot isostatic pressing (HIP) was conducted at a temperature of 450° C. to 500° C. and a pressure of 1000 atms. The hot forging was carried out at a sample temperature of 400° C. The sintering was conduced at a temperature of 800° C.

Films were deposited by using these targets and discharging according to the UBMS method or AIP method under the same conditions as in Experimental Example 1. On the resulting films, hardness was determined and cutting test was conducted by the procedures of Experimental Example 1.

The results are shown in Table 5. Table 5 demonstrates as follows. The target No. 1D has a relative density less than 91% and does not satisfy the requirement according to the sixth embodiment of the present invention (Comparative Example). When the target No. 1D was used, abnormal discharge occurred and film deposition could not be carried out stably.

In contrast, the targets Nos. 2D to No. 8D have a relative density of 91% or more, satisfy the requirements according to the sixth embodiment of the present invention, and are examples of the sixth embodiment of the present invention. When these targets Nos. 2D to No. 8D were used, no abnormal discharge occurred, discharge could be stably conducted, and films could be stably deposited. Of these targets, those having a relative density of 95% or more (targets No. 3D to No. 8D) showed further higher discharge stability.

The films deposited by using the targets Nos. 2D to No. 8D have a small surface roughness Ra, are smooth and have high hardness. They also show a small wear amount in the cutting test and are excellent in wear resistance. With an increasing relative density of the target used, the resulting films show a decreasing surface roughness Ra, an increasing hardness, a decreasing wear amount in the cutting test and more excellent wear resistance. Of these films, those deposited by using targets having a relative density of 95% or more (targets No. 3D to No. 8D) have a smaller surface roughness Ra, higher hardness, a smaller wear amount in the cutting test and are more excellent in wear resistance.

TABLE 1

| | Composition of film (atomic ratio) | | | | | Test result | | | |
|---|---|---|---|---|---|---|---|---|---|
| | Metallic element | | Nonmetallic element | | Crystal structure | Friction | Hardness | Wear amount | |
| No. | Zr | Hf | C | N | of film | coefficient | GPa | μm | Remarks |
| 1 | | | Ti0.5Al0.5N | | B1 | 0.8 | 26 | 65 | Com. Ex. |
| 2 | | | TiN | | B1 | 0.75 | 22 | 75 | Com. Ex. |
| 3 | | | CrN | | B1 | 0.65 | 18 | 100 | Com. Ex. |
| 4 | 1 | 0 | 0 | 1 | B1 | 0.7 | 21 | 80 | Com. Ex. |
| 5 | 0 | 1 | 0.5 | 0.5 | B1 | 0.7 | 22 | 75 | Com. Ex. |
| 6 | 0.98 | 0.02 | 0 | 1 | B1 | 0.7 | 22 | 77 | Com. Ex. |
| 7 | 0.94 | 0.06 | 0 | 1 | B1 | 0.67 | 24 | 58 | |
| 8 | 0.9 | 0.1 | 0 | 1 | B1 | 0.64 | 27 | 52 | |
| 9 | 0.85 | 0.15 | 0 | 1 | B1 | 0.6 | 28 | 50 | |
| 10 | 0.77 | 0.23 | 0 | 1 | B1 | 0.61 | 29 | 49 | |
| 11 | 0.65 | 0.35 | 0 | 1 | B1 | 0.64 | 27 | 53 | |
| 12 | 0.55 | 0.45 | 0 | 1 | B1 | 0.7 | 22 | 65 | Com. Ex. |
| 13 | 0.4 | 0.6 | 0 | 1 | B1 | 0.71 | 21 | 67 | Com. Ex. |
| 14 | 0.85 | 0.15 | 0.2 | 0.8 | B1 | 0.6 | 26 | 53 | |
| 15 | 0.85 | 0.15 | 0.6 | 0.4 | B1 | 0.57 | 27 | 52 | |
| 16 | 0.85 | 0.15 | 0.2 | 0.7 | B1 | 0.55 | 27 | 54 | |
| 17 | 0.85 | 0.15 | 0.1 | 0.9 | B1 | 0.52 | 26 | 53 | |
| 18 | 0.85 | 0.15 | 1 | 0 | B1 | 0.5 | 26 | 55 | |
| 19 | 0.95 | 0.05 | 0 | 1 | B1 | 0.67 | 24 | 59 | |
| 20 | 0.6 | 0.4 | 0 | 1 | B1 | 0.66 | 25 | 57 | |

TABLE 2

| | Composition of Hard film (atomic ratio) | | | | | | Crystal structure of hard film | Test result | | | |
|---|---|---|---|---|---|---|---|---|---|---|---|
| | Metallic element | | | | Nonmetallic element | | | Friction | Hardness of film | Wear amount | |
| No. | Zr | Hf | W | Mo | C | N | | coefficient | GPa | μm | Remarks |
| 1A | | | Ti0.5Al0.5N | | | | B1 | 0.8 | 26 | 65 | Com. Ex. |
| 2A | | | TiN | | | | B1 | 0.75 | 22 | 75 | Com. Ex. |
| 3A | | | CrN | | | | B1 | 0.65 | 18 | 100 | Com. Ex. |
| 4A | 0.85 | 0.15 | | | 0 | 1 | B1 | 0.68 | 27 | 55 | |
| 5A | 0.83 | 0.15 | 0.02 | 0 | 0 | 1 | B1 | 0.67 | 27 | 55 | |
| 6A | 0.84 | 0.15 | 0.01 | 0 | 0 | 1 | B1 | 0.67 | 27 | 55 | |
| 7A | 0.82 | 0.15 | 0.03 | 0 | 0 | 1 | B1 | 0.55 | 29 | 51 | |
| 7A1 | 0.79 | 0.15 | 0.05 | 0 | 0 | 1 | B1 | 0.52 | 30 | 50 | |
| 8A | 0.77 | 0.15 | 0.08 | 0 | 0 | 1 | B1 | 0.45 | 32 | 48 | |
| 9A | 0.7 | 0.15 | 0.15 | 0 | 0 | 1 | B1 | 0.47 | 32 | 45 | |
| 9A1 | 0.65 | 0.15 | 0.2 | 0 | 0 | 1 | B1 | 0.47 | 33 | 43 | |
| 10A | 0.58 | 0.15 | 0.27 | 0 | 0 | 1 | B1 | 0.49 | 29 | 49 | |
| 10A1 | 0.55 | 0.15 | 0.3 | 0 | 0 | 1 | B1 | 0.48 | 29 | 49 | |
| 11A | 0.5 | 0.15 | 0.35 | 0 | 0 | 1 | B1 | 0.5 | 28 | 50 | |
| 12A | 0.4 | 0.15 | 0.45 | 0 | 0 | 1 | B1 | 0.63 | 27 | 54 | |

TABLE 2-continued

| | Composition of Hard film (atomic ratio) | | | | | | Crystal structure of hard film | Test result | | | |
|---|---|---|---|---|---|---|---|---|---|---|---|
| | Metallic element | | | | Nonmetallic element | | | Friction coefficient | Hardness of film GPa | Wear amount μm | Remarks |
| No. | Zr | Hf | W | Mo | C | N | | | | | |
| 13A | 0.69 | 0.15 | 0.1 | 0.06 | 0 | 1 | B1 | 0.47 | 32 | 45 | |
| 14A | 0.6 | 0.15 | 0.15 | 0.1 | 0 | 1 | B1 | 0.47 | 33 | 47 | |
| 15A | 0.63 | 0.2 | 0.17 | 0 | 0.3 | 0.7 | B1 | 0.45 | 32 | 46 | |
| 16A | 0.64 | 0.15 | 0 | 0.21 | 0.6 | 0.4 | B1 | 0.42 | 31 | 43 | |
| 17A | 0.73 | 0.05 | 0.22 | 0 | 0 | 1 | B1 | 0.47 | 32 | 48 | |
| 18A | 0.78 | 0 | 0 | 0.22 | 0 | 1 | B1 | 0.46 | 33 | 46 | |
| 19A | 0.1 | 0.8 | 0.1 | 0 | 0 | 1 | B1 | 0.48 | 32 | 46 | |
| 20A | 0 | 0.85 | 0 | 0.15 | 0 | 1 | B1 | 0.46 | 32 | 45 | |

TABLE 3

| | Composition of film (atomic ratio) | | | | | | | | Crystal structure of film | Test result | | | |
|---|---|---|---|---|---|---|---|---|---|---|---|---|---|
| | Metallic element | | | | | | Nonmetallic element | | | Friction coefficient | Hardness of film GPa | Wear amount μm | Remarks |
| No. | Zr | Hf | W | Mo | Si | B | C | N | | | | | |
| 1B | | | Ti0.5Al0.5N | | | | | | B1 | 0.8 | 26 | 65 | Com. Ex. |
| 2B | | | TiN | | | | | | B1 | 0.75 | 22 | 75 | Com. Ex. |
| 3B | | | CrN | | | | | | B1 | 0.65 | 18 | 100 | Com. Ex. |
| 4B | 0.69 | 0.15 | 0.15 | 0 | 0.01 | 0 | 0 | 1 | B1 | 0.47 | 32 | 45 | |
| 5B | 0.65 | 0.15 | 0.15 | 0 | 0.05 | 0 | 0 | 1 | B1 | 0.45 | 33 | 40 | |
| 6B | 0.61 | 0.15 | 0.15 | 0 | 0.09 | 0 | 0 | 1 | B1 | 0.43 | 35 | 37 | |
| 7B | 0.56 | 0.15 | 0.15 | 0 | 0.14 | 0 | 0 | 1 | B1 | 0.43 | 36 | 39 | |
| 8B | 0.48 | 0.15 | 0.15 | 0 | 0.22 | 0 | 0 | 1 | B1 + B4 | 0.42 | 32 | 39 | |
| 9B | 0.35 | 0.15 | 0.15 | 0 | 0.35 | 0 | 0 | 1 | B4 | 0.44 | 31 | 43 | |
| 10B | 0.68 | 0.15 | 0.15 | 0 | 0 | 0.02 | 0 | 1 | B1 | 0.45 | 32 | 45 | |
| 11B | 0.63 | 0.15 | 0.15 | 0 | 0 | 0.07 | 0 | 1 | B1 | 0.43 | 32 | 41 | |
| 12B | 0.53 | 0.15 | 0.15 | 0 | 0 | 0.17 | 0 | 1 | B1 | 0.4 | 34 | 38 | |
| 13B | 0.45 | 0.15 | 0.15 | 0 | 0 | 0.25 | 0 | 1 | B1 | 0.4 | 35 | 38 | |
| 14B | 0.2 | 0.15 | 0.15 | 0 | 0 | 0.5 | 0 | 1 | B1 + B4 | 0.42 | 31 | 38 | |
| 15B | 0 | 0.96 | 0.17 | 0 | 0.04 | 0 | 0.3 | 0.7 | B1 | 0.44 | 33 | 45 | |
| 16B | 0.66 | 0.07 | 0 | 0.21 | 0 | 0.06 | 0.6 | 0.4 | B1 | 0.4 | 30 | 44 | |
| 17B | 0.79 | 0.2 | 0 | 0 | 0.01 | 0 | 0 | 1 | B1 | 0.65 | 28 | 62 | |
| 18B | 0.75 | 0.2 | 0 | 0 | 0.05 | 0 | 0 | 1 | B1 | 0.55 | 32 | 42 | |
| 19B | 0.71 | 0.2 | 0 | 0 | 0.09 | 0 | 0 | 1 | B1 | 0.56 | 33 | 40 | |
| 20B | 0.66 | 0.2 | 0 | 0 | 0.14 | 0 | 0 | 1 | B1 | 0.54 | 31 | 44 | |
| 21B | 0.58 | 0.2 | 0 | 0 | 0.22 | 0 | 0 | 1 | B1 + B4 | 0.55 | 30 | 45 | |
| 22B | 0.45 | 0.2 | 0 | 0 | 0.35 | 0 | 0 | 1 | B4 | 0.64 | 27 | 64 | |
| 23B | 0.78 | 0.2 | 0 | 0 | 0 | 0.02 | 0 | 1 | B1 | 0.61 | 28 | 61 | |
| 24B | 0.73 | 0.2 | 0 | 0 | 0 | 0.07 | 0 | 1 | B1 | 0.45 | 32 | 42 | |
| 25B | 0.63 | 0.2 | 0 | 0 | 0 | 0.17 | 0 | 1 | B1 | 0.47 | 31 | 40 | |
| 26B | 0.55 | 0.2 | 0 | 0 | 0 | 0.25 | 0 | 1 | B1 + B4 | 0.48 | 31 | 39 | |
| 27B | 0.3 | 0.2 | 0 | 0 | 0 | 0.5 | 0 | 1 | B4 | 0.47 | 28 | 51 | |
| 28B | 0.87 | 0.1 | 0 | 0 | 0.03 | 0 | 0 | 1 | B1 | 0.55 | 31 | 43 | |
| 29B | 0.6 | 0.1 | 0 | 0 | 0.3 | 0 | 0 | 1 | B1 + B4 | 0.57 | 30 | 46 | |
| 30B | 0.87 | 0.1 | 0 | 0 | 0 | 0.03 | 0 | 1 | B1 | 0.47 | 30 | 45 | |
| 31B | 0.6 | 0.1 | 0 | 0 | 0 | 0.3 | 0 | 1 | B1 + B4 | 0.49 | 30 | 44 | |
| 32B | 0.83 | 0.1 | 0 | 0 | 0.07 | 0 | 0 | 1 | B1 | 0.53 | 32 | 40 | |
| 33B | 0.83 | 0.1 | 0 | 0 | 0 | 0.07 | 0 | 1 | B1 | 0.4 | 31 | 40 | |

TABLE 4

| | Composition of film (atomic ratio) | | | | | | | Thickness (nm) | | Crystal Structure of hard film | Test result | | | |
|---|---|---|---|---|---|---|---|---|---|---|---|---|---|---|
| | Hard film A | | | | | | | Hard film A | Hard film B | | Friction coefficient | Hardness of film (GPa) | Wear amount μm | Remarks |
| No. | Zr | Hf | Si | B | C | N | Hard film B | | | | | | | |
| 1C | | | | | | | Ti0.6Al0.5N | — | — | B1 | 0.8 | 26 | 65 | Com. Ex. |
| 2C | | | | | | | TiN | — | — | B1 | 0.75 | 22 | 75 | Com. Ex. |
| 3C | | | | | | | CrN | — | — | B1 | 0.65 | 18 | 100 | Com. Ex. |

TABLE 4-continued

| | Composition of film (atomic ratio) | | | | | | | Thickness (nm) | | Crystal Structure of hard film | Test result | | | |
|---|---|---|---|---|---|---|---|---|---|---|---|---|---|---|
| | Hard film A | | | | | | | Hard | Hard | | Friction | Hardness of | Wear amount | |
| No. | Zr | Hf | Si | B | C | N | Hard film B | film A | film B | | coefficient | film (GPa) | μm | Remarks |
| 4C | 0.8 | 0.2 | 0 | 0 | 0 | 1 | WN | 4 | 5 | B1 | 0.5 | 32 | 45 | |
| 5C | 0.8 | 0.2 | 0 | 0 | 0 | 1 | WN | 20 | 4 | B1 | 0.5 | 33 | 47 | |
| 6C | 0.8 | 0.2 | 0 | 0 | 0 | 1 | WN | 55 | 10 | B1 | 0.52 | 31 | 45 | |
| 7C | 0.8 | 0.2 | 0 | 0 | 0 | 1 | WN | 150 | 7 | B1 | 0.47 | 31 | 46 | |
| 8C | 0.8 | 0.2 | 0 | 0 | 0 | 1 | B0.45C0.1N0.45 | 20 | 4 | B1 | 0.42 | 30 | 43 | |
| 9C | 0.8 | 0.2 | 0 | 0 | 0 | 1 | B0.45C0.1N0.45 | 10 | 3 | B1 | 0.42 | 32 | 44 | |
| 10C | 0.8 | 0.2 | 0 | 0 | 0 | 1 | Si0.45N0.55 | 20 | 3 | B1 | 0.44 | 34 | 40 | |
| 11C | 1 | 0 | 0 | 0 | 0.1 | 0.9 | Mo (C0.1N0.9) | 20 | 5 | B1 | 0.41 | 33 | 43 | |
| 12C | 0.75 | 0.2 | 0.05 | 0 | 0 | 1 | (W0.7Mo0.3) N | 20 | 5 | B1 | 0.42 | 32 | 45 | |
| 13C | 0.65 | 0.2 | 0 | 0.1 | 0 | 1 | (W0.7Mo0.3) N | 20 | 5 | B1 | 0.4 | 31 | 44 | |
| 14C | 0.8 | 0.2 | 0 | 0 | 0 | 1 | WN | 200 | 10 | B1 | 0.45 | 31 | 45 | |
| 15C | 0.8 | 0.2 | 0 | 0 | 0 | 1 | WN | 100 | 100 | B1 | 0.4 | 32 | 43 | |
| 16C | 0.8 | 0.2 | 0 | 0 | 0 | 1 | WN | 20 | 200 | B1 | 0.4 | 31 | 45 | |
| 17C | 0.8 | 0.2 | 0 | 0 | 0 | 1 | WN | 250 | 20 | B1 | 0.6 | 26 | 65 | Com. Ex. |
| 18C | 0.8 | 0.2 | 0 | 0 | 0 | 1 | WN | 10 | 250 | B1 | 0.6 | 25 | 75 | Com. Ex. |
| 19C | 0.8 | 0.2 | 0 | 0 | 0 | 1 | SiCN C = 0.1, Si/N = 0.8 | 20 | 3 | B1 | 0.46 | 36 | 38 | |
| 20C | 0.8 | 0.2 | 0 | 0 | 0 | 1 | SiCN C = 0.15, Si/N = 0.8 | 20 | 3 | B1 | 0.45 | 36 | 37 | |
| 21C | 0.8 | 0.2 | 0 | 0 | 0 | 1 | SiCN C = 0.25, Si/N = 0.8 | 20 | 3 | B1 | 0.47 | 37 | 38 | |
| 22C | 0.8 | 0.2 | 0 | 0 | 0 | 1 | SiCN C = 0.3, Si/N = 0.8 | 20 | 3 | B1 | 0.55 | 31 | 51 | |
| 23C | 0.8 | 0.2 | 0 | 0 | 0 | 1 | SiCN C = 0.05, Si/N = 0.4 | 20 | 3 | B1 | 0.57 | 30 | 53 | |
| 24C | 0.8 | 0.2 | 0 | 0 | 0 | 1 | SiCN C = 0.05, Si/N = 0.5 | 20 | 3 | B1 | 0.47 | 34 | 40 | |
| 25C | 0.8 | 0.2 | 0 | 0 | 0 | 1 | SiCN C = 0.05, Si/N = 0.8 | 20 | 3 | B1 | 0.45 | 35 | 41 | |
| 26C | 0.8 | 0.2 | 0 | 0 | 0 | 1 | SiCN C = 0.05, Si/N = 1 | 20 | 3 | B1 | 0.46 | 34 | 38 | |
| 27C | 0.8 | 0.2 | 0 | 0 | 0 | 1 | SiCN C = 0.05, Si/N = 1.4 | 20 | 3 | B1 | 0.45 | 35 | 40 | |
| 28C | 0.8 | 0.2 | 0 | 0 | 0 | 1 | SiCN C = 0.05, Si/N = 2 | 20 | 3 | B1 | 0.55 | 30 | 51 | |
| 29C | 0.85 | 0.15 | 0 | 0 | 0 | 1 | BCN C = 0.1, B/N = 0.95 | 20 | 3 | B1 | 0.41 | 34 | 38 | |
| 30C | 0.85 | 0.15 | 0 | 0 | 0 | 1 | BCN C = 0.25, B/N = 0.95 | 20 | 3 | B1 | 0.4 | 35 | 37 | |
| 31C | 0.85 | 0.15 | 0 | 0 | 0 | 1 | BCN C = 0.3, B/N = 0.95 | 20 | 3 | B1 | 0.47 | 29 | 53 | |
| 32C | 0.85 | 0.15 | 0 | 0 | 0 | 1 | BCN C = 0.1, B/N = 0.4 | 20 | 3 | B1 | 0.57 | 28 | 55 | |
| 33C | 0.85 | 0.15 | 0 | 0 | 0 | 1 | BCN C = 0.1, B/N = 0.5 | 20 | 3 | B1 | 0.45 | 33 | 44 | |
| 34C | 0.85 | 0.15 | 0 | 0 | 0 | 1 | BCN C = 0.1, B/N = 0.8 | 20 | 3 | B1 | 0.41 | 34 | 40 | |
| 35C | 0.85 | 0.15 | 0 | 0 | 0 | 1 | BCN C = 0.1, B/N = 1.5 | 20 | 3 | B1 | 0.43 | 35 | 41 | |
| 36C | 0.85 | 0.15 | 0 | 0 | 0 | 1 | BCN C = 0.1, B/N = 2 | 20 | 3 | B1 | 0.46 | 29 | 54 | |

TABLE 5

| | Target | | | Test result of film | | | |
|---|---|---|---|---|---|---|---|
| No. | Production method | Relative density % | Discharge upon deposition | Surface roughness Ra μm | Hardness of film GPa | Wear amount μm | Remarks |
| 1D | sintering | 90 | Deposition failure due to discharge concentration | 0.2 | | 55 | Com. Ex. |
| 2D | sintering | 93 | Good | 0.15 | 30 | 40 | |
| 3D | sintering | 95 | Good | 0.1 | 31 | 32 | |
| 4D | HIP | 98 | Good | 0.07 | 33 | 29 | |
| 5D | HIP | 99 | Good | 0.05 | 33 | 25 | |
| 6D | HIP | 100 | Good | 0.05 | 33 | 25 | |
| 7D | hot forging | 99 | Good | 0.05 | 33 | 25 | |
| 8D | hot forging | 100 | Good | 0.05 | 33 | 25 | |

Target composition: $Hf_{0.15}Zr_{0.64}W_{0.15}Si_{0.06}$

As is described above, the hard films according to the present invention have superior wear resistance to conventional TiN hard films and TiAlN hard films, can thereby be suitably used and are useful as hard films for cutting tools and plastic working jigs so as to improve the durability of these tools.

What is claimed is:

1. A hard film comprising $(Zr_{1-a}, Hf_a)(C_{1-x}N_x)$ and satisfying following Conditions (1) and (2):

$0.07 \leq a \leq 0.4$   Condition (1)
$0 \leq x \leq 1$   Condition (2)

wherein "a" and "x" are the atomic ratios of hafnium (Hf) and nitrogen (N), respectively and wherein x is not equal to 1.

2. A hard film comprising $(Zr_{1-a-b}, Hf_a, M_b)(C_{1-x}N_x)$ and satisfying following Conditions (1A) to (4A):

| | |
|---|---|
| $0 \leq 1 - a - b$ | Condition (1A) |
| $0 \leq a$ | Condition (2A) |
| $0.03 \leq b \leq 0.35$ | Condition (3A) |
| $0 \leq x \leq 1$ | Condition (4A) | wherein M is at least one of tungsten (W) and molybdenum (Mo); and "a", "b", and "x" are the atomic ratios of Hf, M, and N, respectively.

3. A hard film comprising $(Zr_{1-a-c}, Hf_a, D_c)(C_{1-x}N_x)$ and satisfying following Conditions (1B) to (3B):

| | |
|---|---|
| $0.05 \leq a \leq 0.4$ | Condition (1B) |
| $0.03 \leq c \leq 0.3$ | Condition (2B) |
| $0 \leq x \leq 1$ | Condition (3B) | wherein D is at least one of silicon (Si) and boron (B); and "a", "c", and "x" are the atomic ratios of Hf, D, and N, respectively.

4. A hard film comprising $(Zr_{1-a-b-c}, Hf_a, M_b, D_c)(C_{1-x}N_x)$ and satisfying following Conditions (1C) to (5C):

| | |
|---|---|
| $0 \leq 1 - a - b$ | Condition (1C) |
| $0 \leq a$ | Condition (2C) |
| $0.03 \leq b \leq 0.35$ | Condition (3C) |
| $0.03 \leq c \leq 0.3$ | Condition (4C) |
| $0 \leq x \leq 1$ | Condition (5C) | wherein M is at least one of tungsten (W) and molybdenum (Mo); D is at least one of silicon (Si) and boron (B); and "a", "b", "c", and "x" are the atomic ratios of Hf, M, D, and N.

* * * * *